United States Patent
Chung et al.

(10) Patent No.: US 12,453,023 B2
(45) Date of Patent: Oct. 21, 2025

(54) HANGING RACK AND IMAGE DEVICE WITH HANGING FUNCTION

(71) Applicant: Qisda Corporation, Taoyuan (TW)

(72) Inventors: Chiao-Yun Chung, Taoyuan (TW); Chi-Chun Wu, Taoyuan (TW)

(73) Assignee: Qisda Corporation, Taoyuan (TW)

( * ) Notice: Subject to any disclaimer, the term of this patent is extended or adjusted under 35 U.S.C. 154(b) by 379 days.

(21) Appl. No.: 18/135,231

(22) Filed: Apr. 17, 2023

(65) Prior Publication Data
US 2024/0032216 A1  Jan. 25, 2024

(30) Foreign Application Priority Data
Jul. 22, 2022 (CN) .......................... 202210866860.8

(51) Int. Cl.
*H05K 5/02* (2006.01)

(52) U.S. Cl.
CPC ................. *H05K 5/0217* (2013.01)

(58) Field of Classification Search
CPC .. H05K 5/0217; H05K 5/0204; H05K 5/0221; G06F 1/1601
See application file for complete search history.

(56) References Cited

U.S. PATENT DOCUMENTS

| | | | |
|---|---|---|---|
| 7,813,118 B2 * | 10/2010 | Burge | H04R 1/026 361/825 |
| 2007/0272819 A1 | 11/2007 | Wang | |
| 2010/0243841 A1 * | 9/2010 | Su | F16B 5/0642 248/297.21 |
| 2021/0137270 A1 * | 5/2021 | Holt | H04B 1/3877 |
| 2022/0308426 A1 * | 9/2022 | Lin | F16M 11/105 |
| 2023/0046711 A1 * | 2/2023 | Wallace | G06F 1/1605 |

FOREIGN PATENT DOCUMENTS

| | | |
|---|---|---|
| CN | 102588717 A | 7/2012 |
| TW | I656795 B | 4/2019 |

* cited by examiner

*Primary Examiner* — Sagar Shrestha

(57) ABSTRACT

A hanging rack is used for a device with a housing, and the hanging rack includes a supporting member and a latching member. One end of the supporting member has a latching slot, and the other end of the supporting member has a hook. The supporting member can slide inside the device with the housing, and the hook can extend outward from the inside of the device with the housing. The latching member is movably arranged in a cavity inside the device with the housing and acted by elastic force, and a tip of the latching member protrudes from the cavity, and the tip is buckled with the latching slot when the latching member is pressed by the supporting member, or the tip is released from the latching slot when the latching member is pressed again by the supporting member.

20 Claims, 5 Drawing Sheets

HANGING RACK AND IMAGE DEVICE WITH HANGING FUNCTION

This application claims the benefit of People's Republic of China application Serial No. 202210866860.8, filed Jul. 22, 2022, the subject matter of which is incorporated herein by reference.

BACKGROUND OF THE INVENTION

Field of the Invention

The invention relates in general to a hanging rack, and more particularly to a hanging rack and an image device with hanging function.

Description of the Related Art

A common display device, such as a liquid crystal display, has a thinner display panel to reduce the overall thickness of the display. Generally speaking, in order to meet the requirements of large size and thinning of the liquid crystal display, the internal space of the housing of the liquid crystal display will be limited and lacks enough space to accommodate other accessories or components. Therefore, how to assemble accessories in a limited housing space and save the structure and assembly costs of accessories is a problem that the industry needs to solve.

SUMMARY OF THE INVENTION

The invention is directed to a hanging rack and an image device with hanging function, wherein the hanging rack can extend outward the housing to provide the function of hanging objects.

According to one embodiment of the present invention, a hanging rack is provided for a device having a housing, and the hanging rack includes a supporting member and a latching member. One end of the supporting member has a latching slot, and the other end of the supporting member has a hook. The supporting member can slide inside the device with the housing, and the hook can extend outward from the inside of the device with the housing. The latching member is movably arranged in a cavity inside the device with the housing, the latching member is acted by elastic force and a tip of the latching member protrudes from the cavity, and the tip is buckled with the latching slot when the latching member is pressed by the supporting member, or the tip is released from the latching slot when the latching member is pressed again by the supporting member.

According to one embodiment of the present invention, an image device with a hanging function is provided, including a display device and a hanging rack. The hanging rack includes a supporting member and a latching member. One end of the supporting member has a latching slot, and the other end of the supporting member has a hook. The supporting member can slide inside the display device, and the hook can extend outward from the inside of the display device. The latching member is movably arranged in a cavity inside the display device, the latching member is acted by elastic force and a tip of the latching member protrudes from the cavity, and the tip is buckled with the latching slot when the latching member is pressed by the supporting member, or the tip is released from the latching slot when the latching member is pressed again by the supporting member.

The above and other aspects of the invention will become better understood with regard to the following detailed description of the preferred but non-limiting embodiment(s). The following description is made with reference to the accompanying drawings.

DETAILED DESCRIPTION OF THE INVENTION

The following embodiments are proposed to describe in detail, and the embodiments are only used as illustrations, and are not intended to limit the scope of protection of the present invention.

Figure 1:
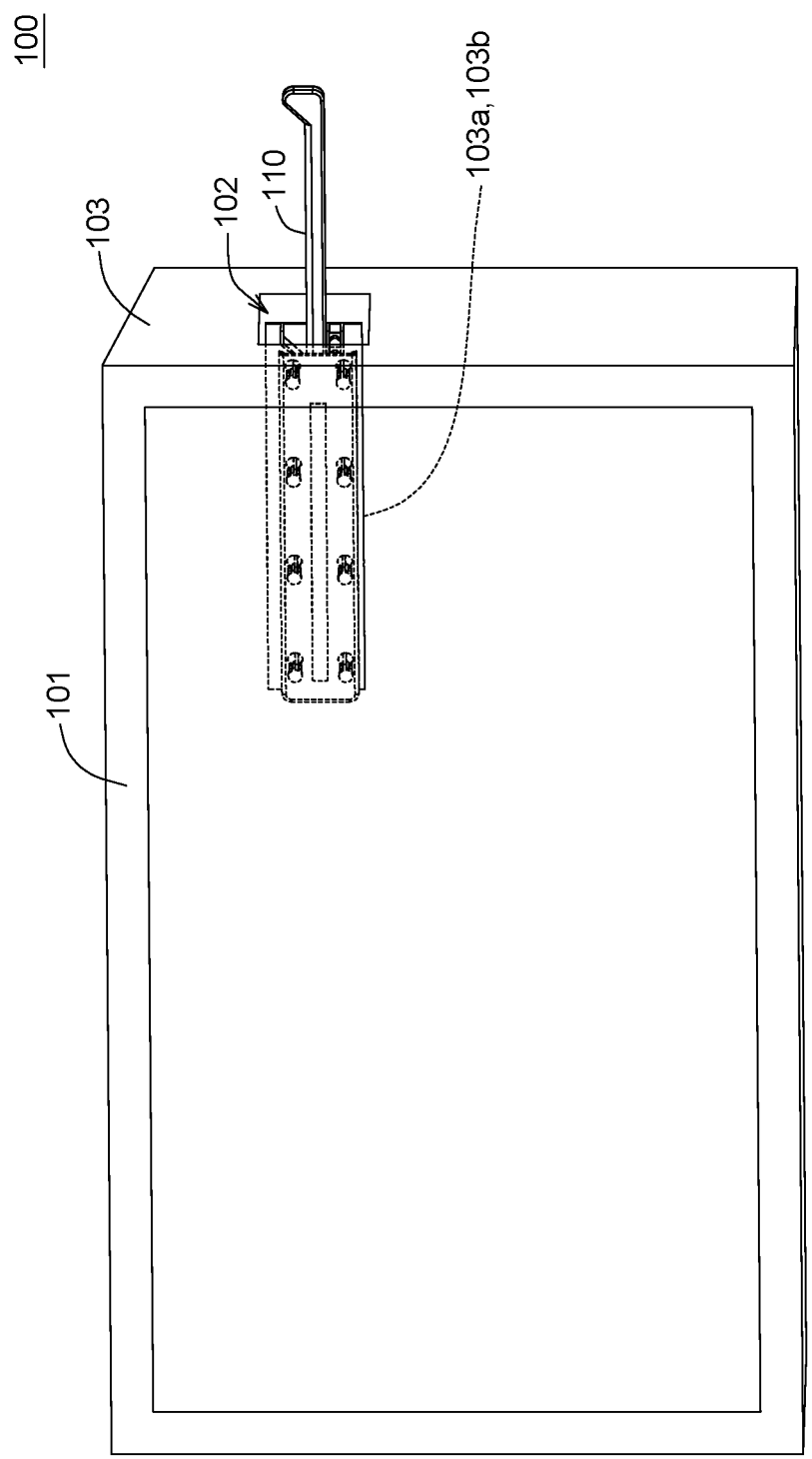
FIG. 1 is a schematic diagram of an image device with a hanging function according to an embodiment of the present invention.
Figure 2A:
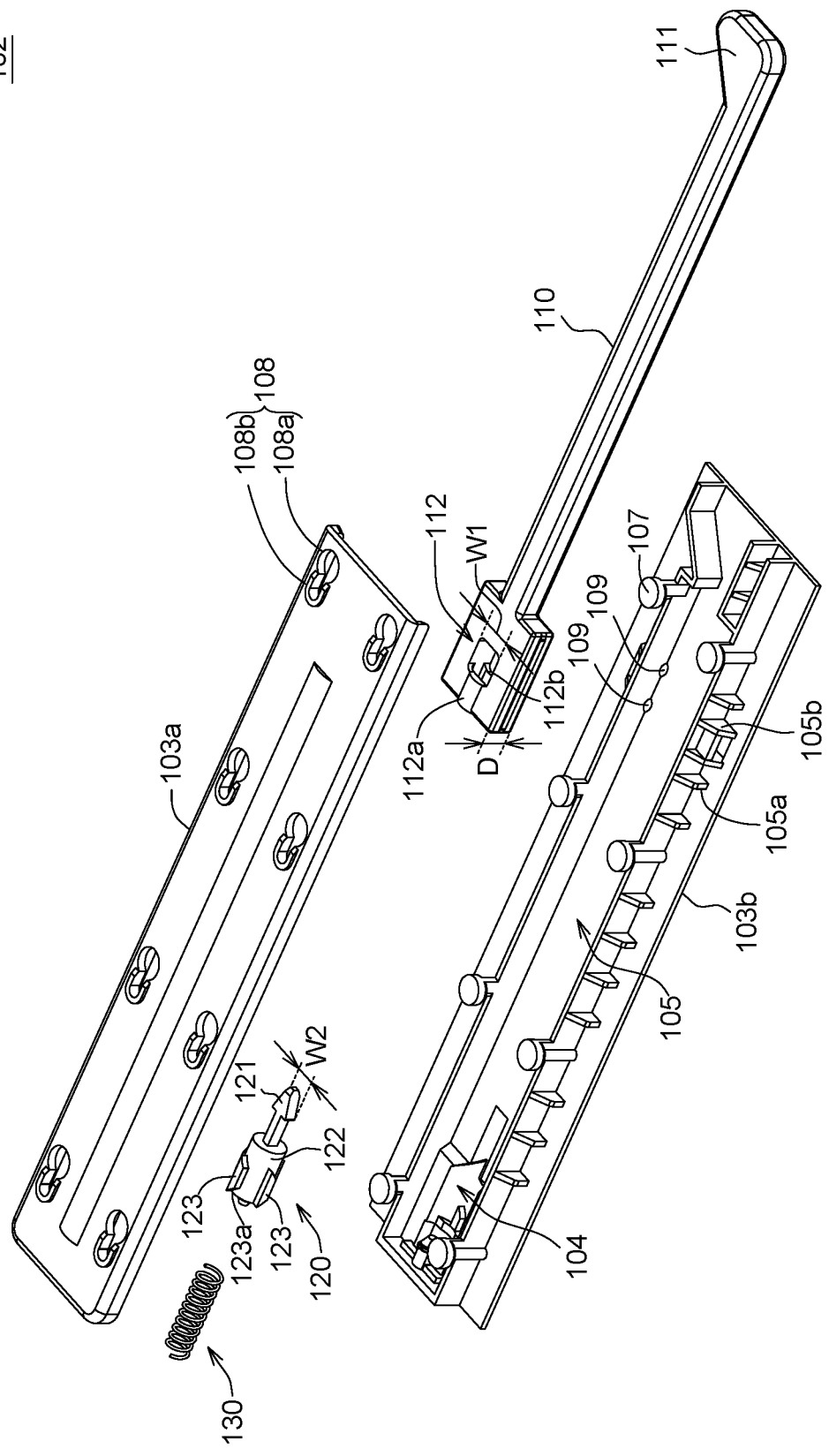
FIGS. 2A and 2B respectively illustrate an exploded view of a hanging rack and two housing parts according to an embodiment of the present invention.
Figure 2B:
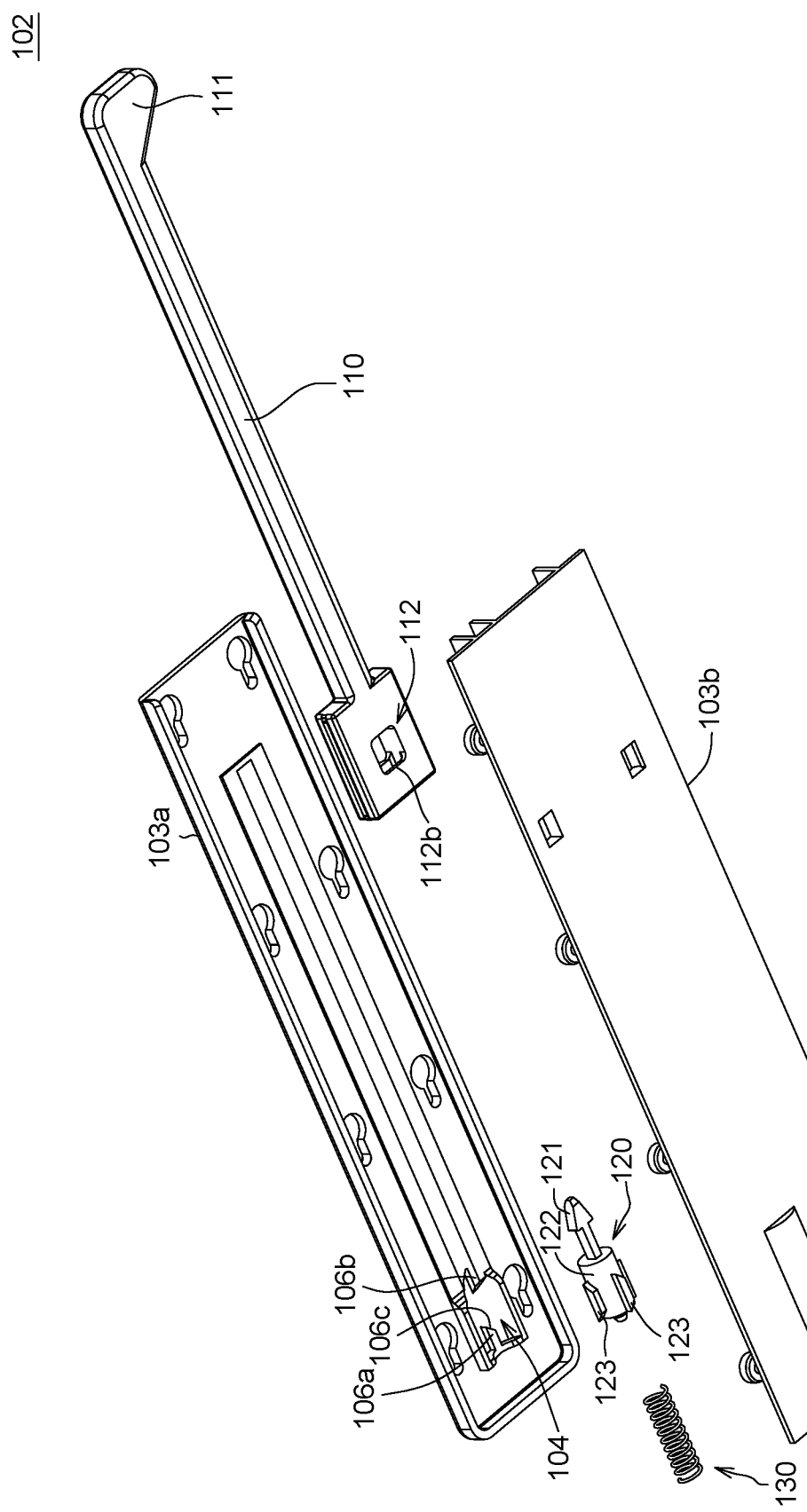
Figure 3A:
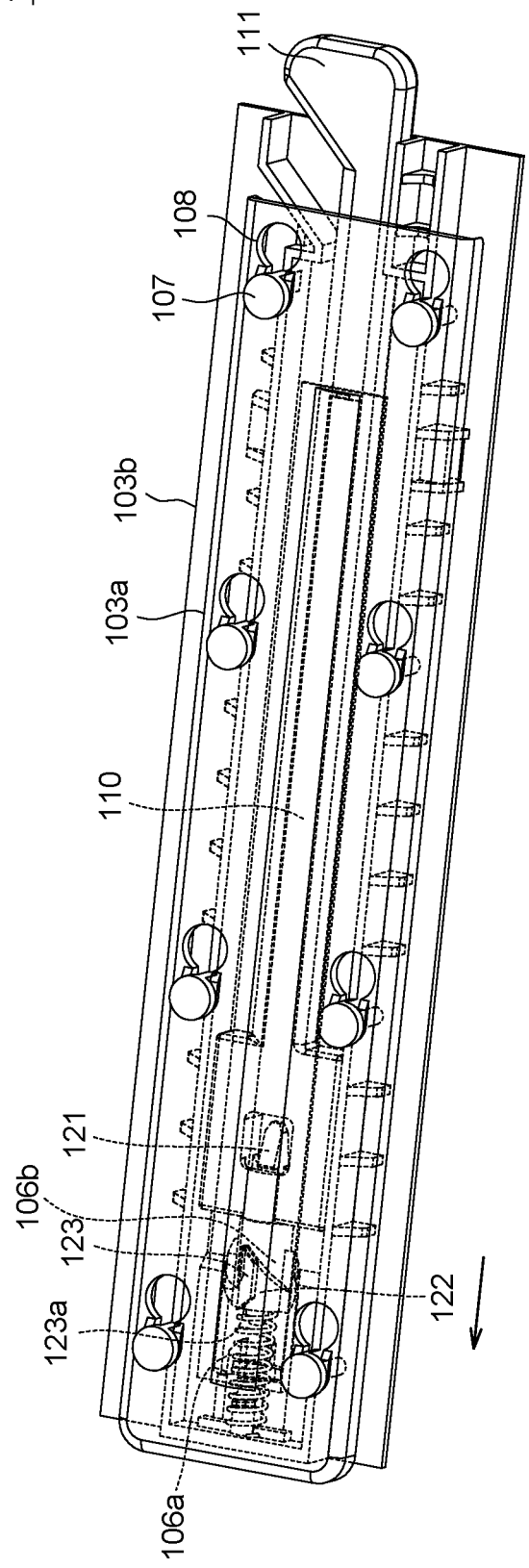
FIG. 3A is a schematic view illustrating that the latching member is pressed by the supporting member and the tip of the latching member is buckled with the latching slot according to an embodiment of the present invention.
Figure 3B:
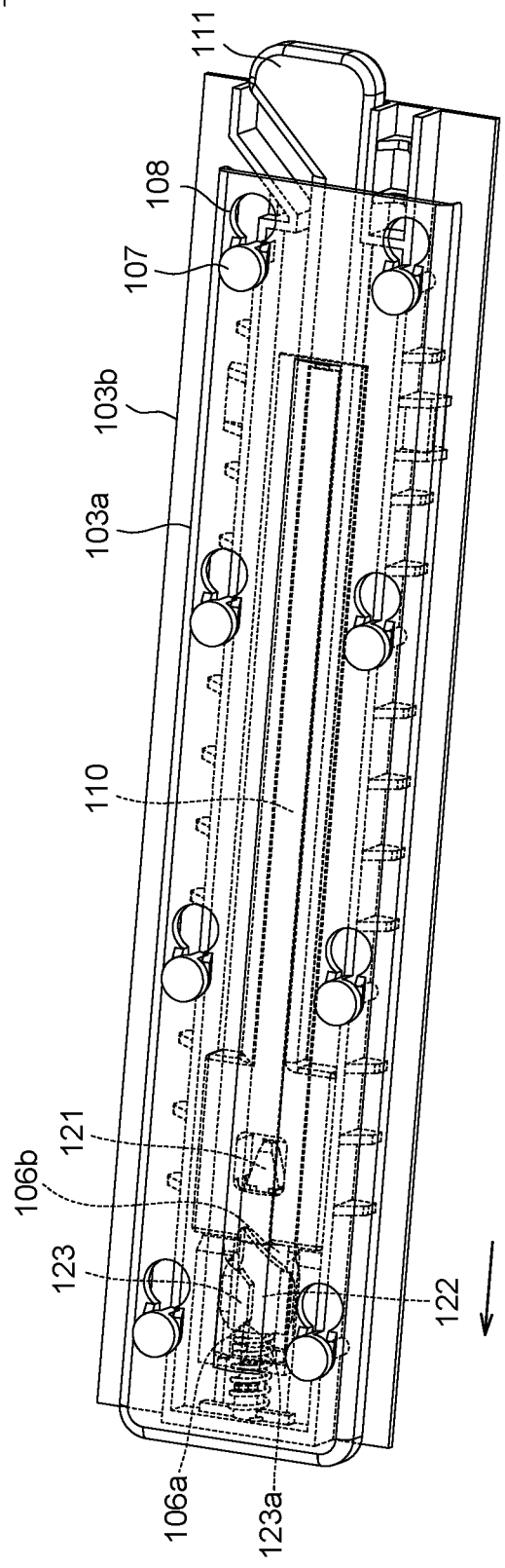
FIG. 3B is a schematic view illustrating that the latching member is pressed again by the supporting member and the tip of the latching member is released from the latching slot according to an embodiment of the present invention.

Referring to FIG. 1, FIG. 2A, FIG. 2B, FIG. 3A and FIG. 3B, FIG. 1 is a schematic diagram of an image device 100 with a hanging function according to an embodiment of the present invention, FIGS. 2A and 2B respectively illustrate an exploded view of a hanging rack 102 and two housing parts 103a, 103b according to an embodiment of the present invention, FIG. 3A is a schematic view illustrating that the latching member 120 is pressed by the supporting member 110 and the tip 121 of the latching member 120 is buckled with the latching slot according to an embodiment of the present invention, and FIG. 3B is a schematic view illustrating that the latching member 120 is pressed again by the supporting member 110 and the tip 121 of the latching member 120 is released from the latching slot 112 according to an embodiment of the present invention.

In one embodiment, the hanging rack 102 is used for a device having a housing 103, and the hanging rack 102 includes a supporting member 110 and a latching member 120. One end of the supporting member 110 has a latching slot 112, and the other end of the supporting member 110 has a hook 111. The supporting member 110 can slide inside the device having the housing 103, and the hook 111 can extend outward from the inside of the device having the housing 103. The latching member 120 is movably (axial direction) disposed in a cavity 104 inside the device with the housing 103, and the latching member 120 is acted by an elastic force and a tip 121 of the latching member 120 protrudes from the cavity 104, and the tip 121 is buckled with the latching slot 112 when the latching member 120 is pressed by the supporting member 110 or the tip 121 is released from the latching slot 112 when the latching member 120 is pressed again by the supporting member 110.

In FIG. 1, the hanging rack 102 is, for example, disposed in the housing 103 of the display device 101, and the supporting member 110 of the hanging rack 102 can extend out of one side of the housing 103 for the user to hang objects, such as hanging earphones, jewelry or small carry-on objects, etc. As shown in FIG. 1, the supporting member 110 is a rod or a long handle. The supporting member 110 can slide inside the display device 101, and the hook 111 of the supporting member 110 can extend outward from inside of the display device 101 for hanging objects. That is, the supporting member 110 has a storage function. When the supporting member 110 is not hanging objects, the supporting member 110 can be accommodated in the housing 103, and the supporting member 110 can be buckled with the latching member 120 to be fixed in the housing 103.

In FIG. 2A and FIG. 2B, the latching slot 112 of the supporting member 110 has, for example, a hollow insertion portion 112a (expressed in the form of a cylindrical hole) and a hollow limiting portion 112b (expressed in the form of an opening), but the present invention is not limited thereto, the hollow insertion portion 112a can be inserted by the tip 121 of the latching member 120, and the tip 121 of the latching member 120 can be positioned in the hollow limiting portion 112b of the latching slot 112. As shown in FIG. 2A, the hollow limiting portion 112b has, for example, a width W1 and a thickness D, and the width W1 is, for example, greater than the width W2 of the tip 121 of the latching member 120 (so that the tip 121 of the latching member 120 is released from the hollow limiting portion 112b at a horizontal position), and the thickness D is, for example, smaller than the width W2 of the tip 121 of the latching member 120 (so that the tip 121 of the latching member 120 can be buckled with the hollow limiting portion 112b at a vertical position). When the tip 121 of the latching member 120 is inserted into the latching slot 112, the tip 121 of the latching member 120 can extend into the hollow limiting portion 112b. The tip 121 is buckled with the hollow limiting portion 112b (as shown in FIG. 3A) when the latching member 120 is pressed by the supporting member 110, or the tip 121 of the latching member 120 is released from the hollow limiting portion 112b (as shown in FIG. 3B) when the latching member 120 is pressed again by the supporting member 110 so as to produce the effect of keep buckling or releasing buckling shown in FIGS. 3A and 3B.

As shown in FIG. 2A and FIG. 2B, an elastic member 130 abuts between one end of the latching member 120 and the housing 103 to provide a resilient force when the latching member 120 is pressed. In addition, the cavity 104 is located between the first housing part 103a and a second housing part 103b, and the latching member 120 can rotate in the cavity 104, and only the tip 121 of the latching member 120 protrudes outward from the cavity 104, the rest is inside the cavity 104. In addition, there is a slide 105 between the first housing part 103a and the second housing part 103b for the supporting member 110 to move in the housing 103. In order to strengthen the rigidity of the first housing part 103a and/or the second housing part 103b, at least one reinforcing rib structure 105a can be arranged around the slide 105, and the reinforcing rib structures 105a are arranged at intervals on two sides of the slide 105, for example. In addition, the reinforcing rib structure 105a can further include at least one stabilizer 105b, located near the exit of the slide 105. When the supporting member 110 pushes from the exit, the stabilizer 105b can provide a stronger stabilizing effect for the supporting member 110, so as to resist the torque generated by the supporting member 110 when hanging objects.

The second housing part 103b is, for example, a part of the middle frame of the housing 103, which can be integrally formed with the middle frame to reduce assembly costs. The first housing part 103a can be a cover plate, which matches the shape of the second housing part 103b to form a mold, so that there is a slide 105 and a cavity 104 connected between the first housing part 103a and the second housing part 103b. The assembled thickness of the first housing part 103a and the second housing part 103b may be in a range from 0.7 cm to 1.0 cm, so as to reduce the occupied space.

In one embodiment, the latching member 120 has a rotating body 122 (for example, cylindrical body), which is rotatably arranged in the cavity 104, and the outer wall of the rotating body 122 and the inner wall of the cavity 104 are provided with a plurality of protruding ribs (hereinafter referred to as first protruding rib 106a/second protruding rib 106b/third protruding rib 123) that abut against each other. In addition, the protruding ribs that abut against each other have a first abutting slope 106c and a second abutting slope 123a (hereinafter referred to as the abutting slopes), and the first abutting slope 106c and the second abutting slope 123a contact in the axial direction of the rotating body 122 to rotate the rotating body 122 by a first angle when the latching member 120 is pressed by the supporting member 110. When the rotating body 122 rotates by a first angle, the latching member 120 is buckled with the latching slot 112. In addition, the first abutting slope 106c further contacts the second abutting slope 123a in the axial direction of the rotating body 122 to rotate the rotating body 122 by a second angle when the latching member 120 is pressed again by the supporting member 110. When the rotating body 122 is rotated by a second angle, the latching member 120 is released from the latching groove 112.

In FIG. 2B, FIG. 3A and FIG. 3B, the inner wall of the cavity 104 of the first housing part 103a is provided with the first protruding rib 106a and the second protruding rib 106b opposite to each other, and the outer wall of the rotating body 122 is provided with a corresponding third protruding rib 123, which is movable between the first protruding rib 106a and the second protruding rib 106b. When the rotating body 122 is pushed against by the elastic member 130, the third protruding rib 123 and the second protruding rib 106b interfere with each other, so that the third rib 123 is positioned in the cavity 104. In FIG. 3B, when the latching member 120 is pressed by the supporting member 110, the third protruding rib 123 moves toward the first protruding rib 106a, the third protruding rib 123 and the first protruding rib 106a abut against each other, and the second abutting slope 123a of the third protruding rib 123 and the first abutting slope 106c of the first protruding rib 106a contact in the axial direction of the rotating body 122 to rotate the rotating body 122 by an angle, for example, 90 degrees. At this time, the tip 121 of the latching member 120 is located at a horizontal position and does not buckle with the hollow limiting portion 112b of the latching slot 112. Therefore, when the tip 121 of the latching member 120 is released from the latching slot 112, the supporting member 110 can be pushed outward. In addition, in FIG. 3B, when the supporting member 110 is pressed again, the third protruding rib 123 moves toward the direction of the first rib 106a, the third protruding rib 123 abuts against the first protruding rib 106a, and the second abutting slope 123a of the third protruding rib 123 and the first abutting slope 106c of the first protruding rib 106a contact in the axial direction of the rotating body 122 to rotate the rotating body 122 by an angle, for example, 90 degrees. At this time, the tip 121 of the latching member 120 is located at a vertical position and buckles with the hollow limiting portion 112b of the latching slot 112, and returns to the buckling state shown in FIG. 3A. In such way, every time when the supporting member 110 is pressed, the rotating body 122 correspondingly rotates by an angle, so that the latching member 120 can be easily switched between the buckling state shown in FIG. 3A and the release state shown in FIG. 3B.

In the present embodiment, the number of the third protruding rib 123 is four, for example, every time when the supporting member 110 is pressed, the rotating body 122 rotates 90 degrees. The difference between the present embodiment and the pop-up switch (such as push-latch switch) is that the traditional pop-up switch uses two fasteners to clamp the latch in the middle of the two fasteners. When the latch is pressed once, the two fasteners will be released, and when the latch is pressed again, the two fasteners will buckle the latch, so that the operation of the buckling the latch and releasing the latch can be completed. In the present embodiment, the latching member 120 and the supporting member 110 have only two parts, and there is no need for screw fixing in assembly, the assembly is relatively easy and low cost, the volume is smaller than the traditional pop-up switch, and the thickness is thinner than the traditional pop-up switch, so that the present embodiment is suitable for the housing 103 with limited internal space.

In one embodiment, the first housing part 103a and the second housing part 103b respectively have at least one limiting hole 108 and at least one limiting member 107 slidably engaged with each other. In addition, the first housing part 103a or the second housing part 103b is provided with at least one positioning member 109 in the slide 105, and the positioning member 109 is used for positioning the supporting member 110 in the slide 105. In one embodiment, the positioning member 109 and the supporting member 110 are positioned magnetically or in a concave-convex structure.

Please refer to FIG. 2A, the limiting hole 108 is, for example, a gourd hole, and the limiting member 107 is, for example, a T-shaped rod, which does not fix with screws during assembly. The limiting hole 108 has a first aperture portion 108a and a second aperture portion 108b, the opening size of the first aperture portion 108a is larger than the opening size of the second aperture portion 108b. The top of the T-shaped rod can pass through the larger first aperture portion 108a, and then slide the first housing part 103a horizontally, and the T-shaped rod moves into the smaller second aperture portion 108b, so that the top of T-shaped rod can be slidably engaged with the smaller second aperture portion 108b.

In addition, the positioning member 109 is used to position the supporting member 110 in the slide 105, for example, in the middle of the slide 105 or at the terminal of the slide 105. The type of the positioning member 109 is not limited and the number can be one or more, such as a positioning bump, a positioning groove, a magnetic member, or a rough surface provided on the surface of the slide 105, so that the supporting member 110 is positioned when it contacts the rough surface. That is to say, when the positioning member 109 is a positioning bump, the supporting member 110 can have one or more positioning grooves, and when the positioning bump engages with one of the positioning grooves, it will be positioned, and the positioning grooves can be arranged at intervals, so that the supporting member 110 can be stopped at different positioning points. On the other hand, when the supporting member 110 has a positioning bump, the positioning member 109 can have one or more positioning grooves, and when the positioning bump engages with one of the positioning grooves, it will be positioned, and the positioning grooves can be arranged at intervals so that the supporting member 110 can be stopped at different positioning points. Alternatively, the positioning member 109 or the supporting member 110 can include one or more magnets, so that when the supporting member 110 moves along the slide 105, the positioning member 109 and the supporting member 110 are magnetically attracted to each other to achieve positioning or multiple-point positioning.

According to the hanging rack 102 and the imaging device 100 with the hanging function according to the above-mentioned embodiments of the present invention, it can be seen that the entire operation process is as follows: when the hanging rack 102 is to be received in the device with the housing 103, the latching member 120 is pressed by the supporting member 110, and the latching member 120 pushes against the elastic member 130 and abuts against the first protruding rib 106a of the cavity 104 with the third protruding rib 123, and then, the first abutting slope 106c and the second abutting slope 123a interfere in an axial direction to rotate the rotating body 122 of the latching member 120 by an angle. That is to say, every time when the latching member 120 is pressed, the first abutting slope 106c and the second abutting slope 123a will interfere to each other again. In such way, the operation of rotating the latching member 120 after pressing is repeated, and the tip 121 of the latching member 120 and the latching slot 112 have two modes of buckling and releasing to switch, so that the supporting member 110 can be easily switched between the buckling state and the release state. This way can practically save the structure and assembly cost of the accessories.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A hanging rack for a device with a housing, the hanging rack comprising:
   a supporting member, one end of the supporting member having a latching slot, other end of the supporting member having a hook, wherein the supporting member can slide inside the device with the housing, and the hook can extend outward from inside of the device with the housing; and
   a latching member movably arranged in a cavity inside the device with the housing, wherein the latching member is acted by elastic force and a tip of the latching member protrudes from the cavity, and the tip is buckled with the latching slot when the latching member is pressed by the supporting member, or the tip is released from the latching slot when the latching member is pressed again by the supporting member.

2. The hanging rack according to claim 1, wherein the latching member comprises a rotating body rotatably disposed in the cavity, and an outer wall of the rotating body and an inner wall of the cavity are provided with a plurality of protruding ribs abutting against each other.

3. The hanging rack according to claim 2, wherein the plurality of protruding ribs abutting against each other comprise a first abutting slope and a second abutting slope, the first abutting slope and the second abutting slope contact in an axial direction of the rotating body to rotate the rotating body by a first angle.

4. The hanging rack according to claim 3, wherein when the rotating body rotates by the first angle, the latching member is buckled with the latching slot.

5. The hanging rack according to claim 3, wherein the first abutting slope and the second abutting slope contact again in the axial direction of the rotating body to rotate the rotating body by a second angle.

6. The hanging rack according to claim 5, wherein when the rotating body rotates by the second angle, the latching member is released from the latching slot.

7. The hanging rack according to claim 1, wherein the device with the housing comprises a first housing part and a second housing part, and a part of the latching member and an elastic member are arranged in the cavity between the first housing part and the second housing part, the supporting member is arranged in a slide between the first housing part and the second housing part, and at least one of the first housing part and the second housing part is provided with at least one reinforcing rib structure around the slide.

8. The hanging rack according to claim 7, wherein the first housing part and the second housing part respectively have at least one limiting hole and at least one limiting part slidably engaged with each other.

9. The hanging rack according to claim 7, wherein the first housing part or the second housing part is provided with at least one positioning member in the slide, and the positioning member is used to position the supporting member in the slide.

10. The hanging rack according to claim 9, wherein the positioning member and the supporting member are positioned magnetically or in a concave-convex structure.

11. An image device with hanging function, comprising:
a display device; and
a hanging rack, comprising:
a supporting member, one end of the supporting member having a latching slot, other end of the supporting member having a hook, wherein the supporting member can slide inside the display device, and the hook can extend outward from inside of the display device; and
a latching member movably arranged in a cavity inside the display device, wherein the latching member is acted by elastic force and a tip of the latching member protrudes from the cavity, and the tip is buckled with the latching slot when the latching member is pressed by the supporting member, or the tip is released from the latching slot when the latching member is pressed again by the supporting member.

12. The imaging device according to claim 11, wherein the latching member comprises a rotating body rotatably disposed in the cavity, and an outer wall of the rotating body and an inner wall of the cavity are provided with a plurality of protruding ribs abutting against each other.

13. The image device according to claim 12, wherein the plurality of protruding ribs abutting against each other comprise a first abutting slope and a second abutting slope, the first abutting slope and the second abutting slope contact in an axial direction of the rotating body to rotate the rotating body by a first angle.

14. The image device according to claim 13, wherein when the rotating body rotates by the first angle, the latching member is buckled with the latching slot.

15. The imaging device according to claim 13, wherein the first abutting slope and the second abutting slope contact again in the axial direction of the rotating body to rotate the rotating body by a second angle.

16. The imaging device according to claim 15, wherein when the rotating body rotates by the second angle, the latching member is released from the latching slot.

17. The image device according to claim 11, wherein the display device comprises a first housing part and a second housing part, and a part of the latching member and an elastic member are arranged in the cavity between the first housing part and the second housing part, the supporting member is arranged in a slide between the first housing part and the second housing part, and at least one of the first housing part and the second housing part is provided with at least one reinforcing rib structure around the slide.

18. The imaging device according to claim 17, wherein the first housing part and the second housing part respectively have at least one limiting hole and at least one limiting part slidably engaged with each other.

19. The imaging device according to claim 17, wherein the first housing part or the second housing part is provided with at least one positioning member in the slide, and the positioning member is used to position the supporting member in the slide.

20. The imaging device according to claim 19, wherein the positioning member and the supporting member are positioned magnetically or in a concave-convex structure.

* * * * *